US006617586B2

(12) United States Patent
Woodburn et al.

(10) Patent No.: US 6,617,586 B2
(45) Date of Patent: Sep. 9, 2003

(54) BEAM DELIVERY SYSTEM

(75) Inventors: David Woodburn, Caterham (GB); Walter Crewson, Ridgefield, CT (US)

(73) Assignee: ScandiNova AB, Stockholm (SE)

( * ) Notice: Subject to any disclaimer, the term of this patent is extended or adjusted under 35 U.S.C. 154(b) by 0 days.

(21) Appl. No.: 10/050,146

(22) Filed: Jan. 18, 2002

(65) Prior Publication Data

US 2003/0136917 A1 Jul. 24, 2003

(51) Int. Cl.[7] .................................................. H01J 37/30
(52) U.S. Cl. ................................ 250/396 ML; 250/398
(58) Field of Search ......................... 250/396 ML, 306, 250/311, 356 R, 398, 492.2, 492 A, 492 B; 219/121 EB, 121 EM; 313/361

(56) References Cited

U.S. PATENT DOCUMENTS 4,295,048 A * 10/1981 Cleland et al. ............. 250/398
5,847,401 A * 12/1998 McKeown et al. .. 250/396 ML

* cited by examiner

*Primary Examiner*—John R. Lee
*Assistant Examiner*—Christopher M. Kalivoda
(74) *Attorney, Agent, or Firm*—Bacon & Thomas, PLLC

(57) ABSTRACT

A beam delivery system uses a set of electronically controlled magnets with a common magnetic yoke to steer the beam directly onto the products being irradiated with a very short distance between the magnets and the products.

12 Claims, 4 Drawing Sheets

BEAM DELIVERY SYSTEM

BACKGROUND OF THE INVENTION

1. Field of the Invention

This invention relates in general to a beam delivery system and in particular to a beam delivery system that controls an electron beam by means of electromagnets having a common magnetic return yoke.

2. Description of Related Art

Electro-magnets are used to control electron beams in the process of irradiating surfaces of products. Conventional techniques use scanning magnets for this purpose. One of the drawbacks of using scanning magnets is the fact that they are very large. They have to be large since a considerable distance between the magnets and the products being radiated is required to obtain an even distribution of the beam over the whole surface. Moreover, since the conventional arrangements are very large, a large amount of shielding is required to contain the radiation.

Various different types of systems use scanning magnets as the electron beam directing means. Two such systems are shown in the appended drawings. FIG. 1 schematically shows a conventional single sided scanning system and FIG. 2 schematically shows a conventional two sided scanning system. Both of these systems, as can be seen, are constructed to direct an accelerated beam of electrons evenly onto a product. Since the irradiation of products in industrial applications is, in general, performed on consecutive products that are moving along in some direction with respect to the system, it is of the utmost importance to ensure that each of the passing products gets an equal amount of radiation, and furthermore that the whole surface of the products gets irradiated.

In the illustrated types of conventional system, the electron beam is composed of short pulses (microseconds) of electrons, with a longer (milliseconds) time gap between them. As a result, the cross-sectional area of the beam must be enlarged from the concentrated form in which it was generated before it impinges on the surface, to avoid "spots" or "stripes" of radiation on the irradiated products. In addition, the system that controls the delivery of the beams onto the products to be radiated must be capable of directing the pulses onto every possible area of the total surface of each product.

This results in the problem that it is difficult to optimize the size of the scanning magnets and the magnet-to-product distance while still achieving complete and uniform coverage of the total surface of the products, particularly since the optimum size necessary to prevent spots or stripes and ensure complete radiation coverage depends not only on scanning magnet size and distance, but also on the shape and orientations of the products to be irradiated, as can be understood from the example of a rectangular product that moves in a perpendicular direction with respect to the beams. In that case, some energy carried by the beam will inevitably be lost since the beam impinges on the surface in the form of a cone, and thus parts of the beam will radiate into the space at each side of the product. Furthermore, the sides of the product will not be adequately covered. To solve this problem, it is necessary to achieve better control of the beam delivery system, and particularly the ability to irradiate the boundaries of the product at beam angles that differ from perpendicular.

U.S. Pat. No. 4,295,048, Cleland et al., discloses an example of a method and a system for scanning a beam of charged particles in order to control a radiation dose distribution. The system is implemented by deflecting the beam through a plurality of positions along the conveyor path along which products that are to be irradiated are moving, through a single beam scanning device or a series of deflecting magnets arranged along a beam pipe. One drawback of this approach is the size of the system, which is significantly larger than the delivery system of the present invention. Furthermore, it is not possible, in a device of the type disclosed in U.S. Pat. No. 4,295,048, to direct beams in several directions without adjusting the beam delivery system mechanically, making it relatively difficult to control the beam.

SUMMARY OF THE INVENTION

It is therefore a first objective of the present invention to provide a beam delivery system that can be closer to the product and is easier to control, and that is capable of irradiating the boundaries of the product at beam angles that differ from the perpendicular.

It is a second objective of the present invention to provide a beam delivery system that has a distance to the products that is much smaller than in the prior art, and furthermore to provide a better controlled beam that can irradiate the products at controlled angles.

It is a third objective of the present invention to provide a beam delivery system that is much smaller than prior art systems.

It is a fourth objective of the invention to provide a system with optimized focusing of the beam.

It is a fifth objective of the invention to provide a beam delivery system that gives improved surface dose homogeneity on the product.

These objectives are achieved by a beam delivery system that includes a set of electronically controlled magnets with a common magnetic yoke. The invention uses a set of small magnets to steer the beam directly onto the products being irradiated with a very short distance between the magnets and the products. The system is used to control the distribution of charged particles over one or several product positions, and makes it possible to direct the beams onto desired positions on the product/products. Because of the short distance between the magnets and the products, it is possible to make the overall system much smaller and, as a consequence, much less shielding is demanded.

As this invention relates to a beam delivery system, those skilled in the art will recognize that, in all embodiments of the invention, a device that radiates charged particles, e.g. electrons, must be provided. This device might be an accelerator of electrons or any other suitable means that can provide a beam of charged particles. The beam of electrons may, for example, be used to irradiate a product that is passing an area where the surface of the product is being covered by charged particles. The surface of the product is preferably parallel to the initial, undirected beam, and moves in a direction that is close to and approximately perpendicular to the initial, undirected beam.

The beam delivery system of the invention includes both an accelerating means for accelerating charged particles and a beam directing means made up of sets of magnets, each magnet being constructed from a coil wound around a core leg and a magnetic pole face. All of the magnets have a common return yoke, the magnets being spaced along the axis of the yoke and perpendicular to the initial beam path, with a gap formed between opposite magnet pole faces and arranged such that pulses of an undisturbed beam emanating from the beam radiating device propagate in the gap. In the preferred embodiment, the beam or beam pulses propagate through a vacuum tube or a vacuum chamber. The magnetic fields, generated between opposite magnetic pole faces, are provided through the coils on "the leg parts" of the magnets, and these coils are connected by switches to one or a number of external power supplies.

The beam can be viewed as a train of electron pulses, where every pulse consists of a large amount of electrons, and the pulses are sent with time gaps between them. The first pulse is directed onto a predetermined position on the product by the first set of magnets, the second by subsequent sets of magnets and so forth. Control of the magnets may, in the preferred embodiment, be obtained through "synchronizing means" that synchronize the application of power to individual magnets or sets of magnets, with the timing of electron pulses supplied by the accelerator device, e.g., through the application of clock or timing pulses or signals. In addition, control of the magnets may be achieved by one or more computer controlled power supplies that supply differing amounts of power to respective magnets or sets. The currents fed to the coils may be negative or positive, and each pair of opposite coils may have its own power supply, or several coils may share a common power supply. Each magnet comprises two opposite legs and the corresponding current coils. Both coils of each pair of opposite legs are preferably connected in series and equally and simultaneously energized to thereby generate a magnetic field between opposite magnetic pole faces that will act as the steering means for the beam and direct the beam onto the target or product.

As it is possible to turn the beam in first one direction and then reverse it to a second completely opposite direction, it becomes possible to irradiate products traveling both above and below the beam distribution system. This is of course a major advantage, and is obtained by generating alternating magnetic field strengths down the beam path, which gives differing angles of direction for the pulses. In this manner, the problem given earlier about energy losses occurring upon irradiating the boundaries of a product can be handled. It is furthermore possible to energize adjacent magnets at the same time in order to enhance the steering or to control the gradient of the field, and thereby to obtain better focusing of the beam.

As a product passes the beam distribution system, the set of magnets will therefore "bend" the beams towards the product surface. The system is set to an initial value for the magnetic field between the magnetic pole faces before the first pulse enters the system. As the first pulse enters, it is bent by the magnetic field in the first pair of magnets. In the preferred arrangement, the first pair of magnet poles is not used to steer the beam directly onto the product, but to generate the desired fringe field and beam direction for the second pair of poles. The system is then reset and the second sent pulse is directed by the subsequent magnets, and so on. These settings and resettings are obtained through the above-mentioned synchronization means. Depending on the size of the magnet poles and the distance between magnets and products, one or several pulses are directed onto the product with different currents in the coils for predetermined combinations of poles before the next set of magnets is selected. This differential current arrangement can apply to any combination in adjacent magnets. During the process the system steers consecutive pulses in the pulse train by consecutive magnets on the yoke to produce a train of overlapping beam spots onto the product. When the train of beam spots has completely covered the product from a first side to the opposite side, the process restarts on the first side. The time that the train takes to sweep from side to side is very fast in relation to the time taken for the product to pass the irradiation area. The configuration of all magnets on a common yoke thereby provides a system that gives an evenly distributed radiation dose and covers the entire surface of the product. Furthermore, it makes it possible to have a much, much smaller arrangement than in prior art systems.

The configuration of the magnet pole faces illustrated herein is of course not the only possible configuration that can be used. It is instead possible to use any geometrical configuration of magnet pole faces on a common yoke. The particular configuration to use is dependent on what beam paths one desires to obtain. For example, different geometrical configurations and their beam paths may, according to the invention, have one row of magnets or several rows of magnets. A person skilled in the art should recognize other configurations and their beam paths. It is also possible to have a stack of rows of magnets with a common yoke. All these different configurations could be used to deliver beams from different directions onto the products, e.g. double sided irradiation.

DETAILED DESCRIPTION OF THE PREFERRED EMBODIMENTS

The invention will now be described with respect to a simple embodiment that comprises a single row of magnets on a common yoke. As was emphasized earlier, this is just an example of a possible configuration of the present invention, but it is a good embodiment and also a simple enough embodiment to illustrate the principles of the invention. Those skilled in the art will appreciate that even though some characteristics of the preferred embodiment, such as distances and the like, are described in detail herein, the preferred characteristics should be viewed as completely optional since they are included solely on the basis of giving the best mode of the invention presently known to the inventors, and not by way of limitation.

Figure 1:
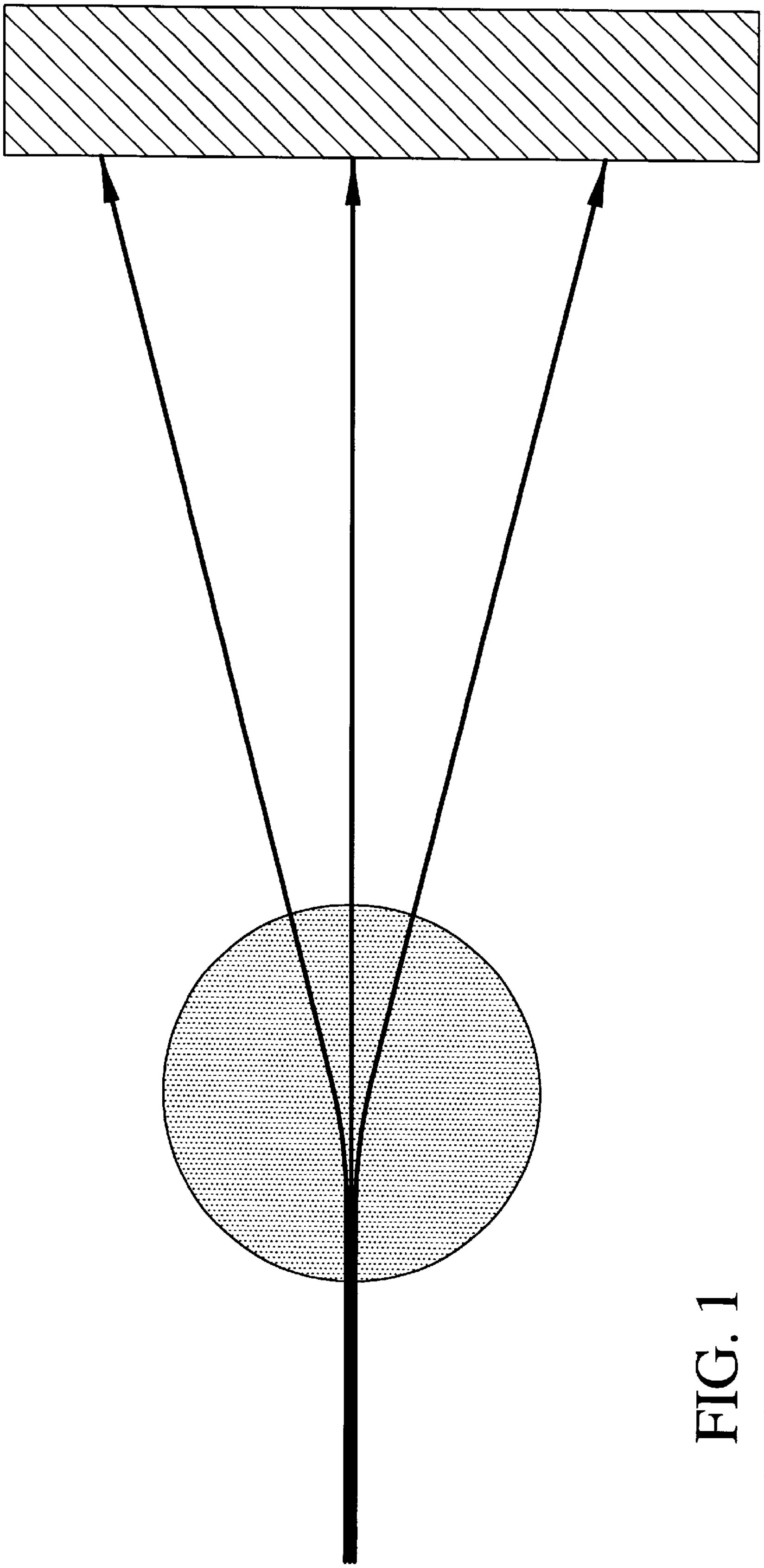
FIG. 1 (Prior Art)
FIG. 1 is a view of a single sided scanning system in prior art beam delivery systems.
Figure 2:
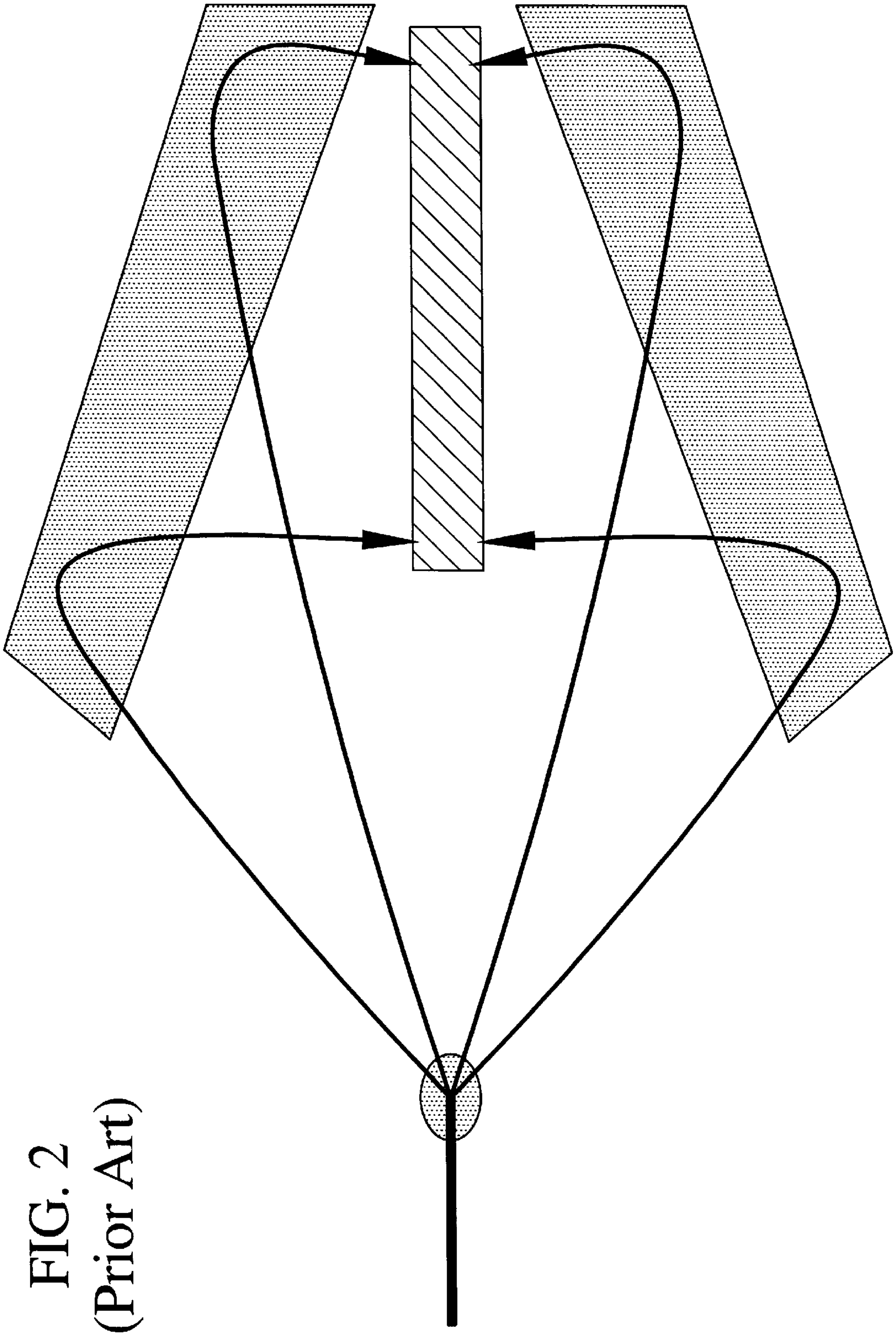
FIG. 2 (Prior Art)
FIG. 2 is a schematic view of a double sided scanning system in prior art beam delivery systems.
Figure 3:
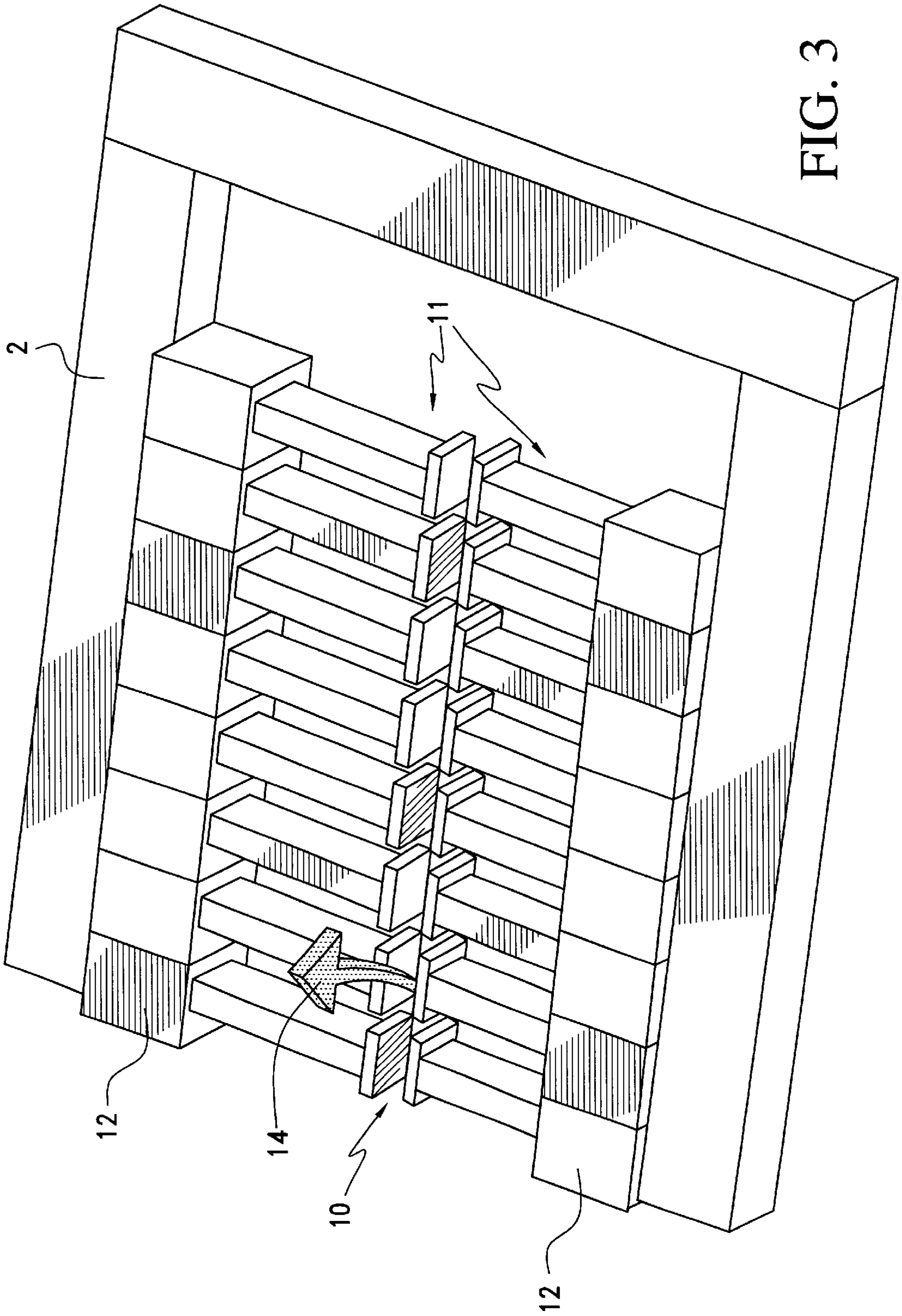
FIG. 3 is a top view of the beam delivery system according to one preferred embodiment of the present invention with a single row of magnets on a common return yoke.
Figure 3A:
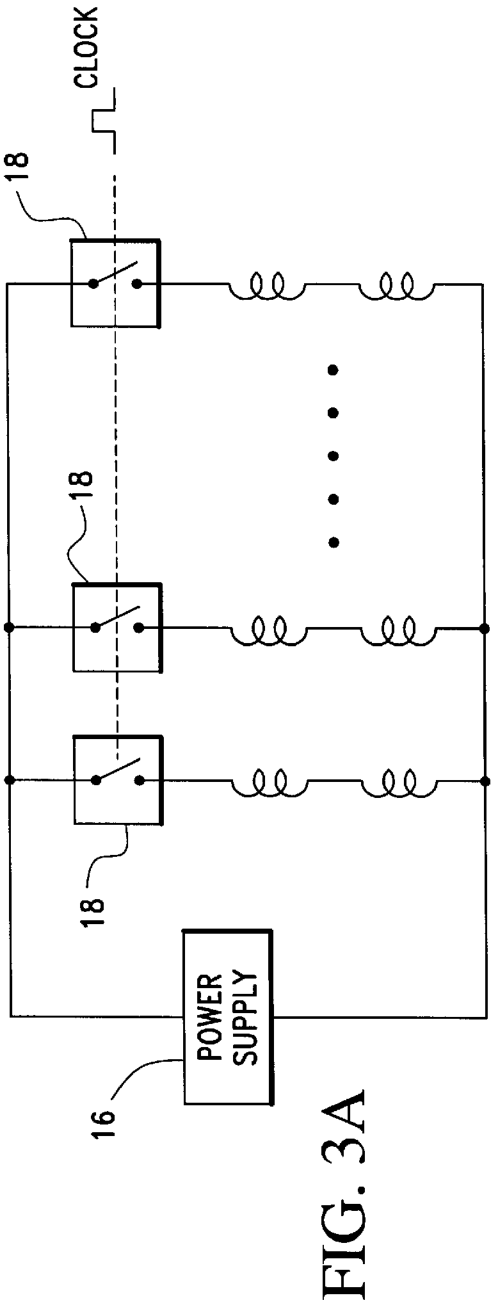
FIG. 3A is a schematic diagram of a circuit that may be used with the beam delivery system of FIG. 3.

In particular, in this embodiment, the magnets on a common yoke (2) have the configuration shown in FIG. 3. The yoke carries two opposite rows of legs (11) with magnet pole faces (10). All adjacent magnet pole faces on each side of the yoke (2) are equally spaced along the central axis of the yoke, and furthermore are spaced a distance from the opposite set of magnet pole faces. The magnetic fields in the magnets are generated through coils (12) that are wound around each of the core legs and connected to at least one power supply (16) through one or more switches (18). The coils (12) are fed with currents, negative or positive, from the at least one power supply (16). Each pair of opposite coils may have its own power supply, or two or more pairs of the coils may share a common power supply. Each magnet comprises two opposite legs with a corresponding pair of coils that are preferably connected in series and equally and simultaneously energized, thereby generating a magnetic field between opposite magnetic pole faces that will act as the steering means for the beam (14) and direct the beam onto the target or product.

In this example where the legs (11), coils (12), and pole faces (10) are aligned on an axis along the yoke in a direction perpendicular to the initial beam path, and the coils (12) are all respectively connected to a main switch(s) (18) that feeds them with current on command, the spacing between adjacent magnets may be between ¼ of a centimeter and 3 cm, and more preferably between ½cm and 2 cm, e.g, 1 cm. The length of the edges of the quadratically formed magnetic pole faces are between 1 cm and 10 cm, and preferably between 3 cm and 8 cm, e.g., 6 cm, and the gaps between opposite magnetic pole faces are between 1 and 5 cm, e.g., approximately 2 cm. The accelerator means is preferably an accelerator of charged particles that delivers pulsed beams with a time gap of 1 to 100 milliseconds and a duration of between ½ and 10 microseconds, the amount of beam current to be delivered being controlled by the accelerator. The accelerator system also controls the time of switching through triggering via clock pulses. The pulsed beams that are delivered from the accelerator propagate through a vacuum tube into the beam directing system.

The products to be irradiated follow a path in which the surface of the product is parallel to the initial, undirected beam. The product moves in a direction that is close to and approximately perpendicular to the initial, undirected beam. To direct the beams onto the product in this specific embodiment, the switch or switches (18) may be computer controlled so as to be synchronized with the accelerator system. In addition, power supply or supplies (16) may be computer controlled to control the amount of current supplied to a respective set or sets of coils (12).

Initially, the first set of the plurality of magnets is set to direct the first pulse to the product, and the direction and the desired position is determined by the current balance in the coils, through the computer controlled power supply. After this, the second pulse enters and is directed onto the product by the second one of the plurality of magnets. When all of the plurality of magnets have directed a pulse the process restarts. This process continues until the entire product being irradiated has passed across the delivery system. The product then turns and returns on the opposite side of the system, with the pulses now directed to the product by shifting the magnetic fields between the opposite lying pole faces, thus bending the beams in that direction, through the operation of the system as given above. In this way, it is possible to irradiate the same surface of the product or, if desired, the other side of the product (if the product is turned somewhere along the way back to the system). If the yoke is provided with two or more rows of magnets, and other external power supplies, it is also possible to irradiate two products at the same time, one on each side of the delivery system.

In the preferred arrangement, the first pair of magnet poles is not used to steer the beam directly onto the product, but to generate the desired fringe field and beam direction for the second pair of poles. The system is then reset and the second sent pulse is directed by the subsequent magnets, and so on. Depending on the size of the magnet poles and the distance between magnets and products, one or several pulses may be directed onto the product with different currents in the coils of, for example, the first and second poles, before the next set of magnets is selected. This differential current arrangement can apply to any combination of adjacent magnets. During the process the system steers consecutive pulses in the pulse train by consecutive magnets on the yoke to produce a train of overlapping beam spots onto the product. When the train of beam spots has completely covered the product from a first side to the opposite side, the process restarts on the first side. The time that the train takes to sweep from side to side is very fast in relation to the time taken for the product to pass the irradiation area, resulting in a system that gives an evenly distributed radiation dose, covers the entire surface of the product, and yet is substantially smaller than prior art systems.

Since each single pair of magnets can be energized or not individually, it is possible to guide a beam to a specific position. One can furthermore generate a specific magnetic field for a specific pair of magnets by means of the current balance in the coils using the computer controlled power supply means discussed above, synchronized with the accelerator device, and hence it is possible to obtain an arrangement that ensures that the boundaries are radiated from angles that are slightly tilted with respect to a direction normal to the plane parallel to the product's surface. This enables energy losses in the radiation to be minimized, and makes alignment of the magnet much easier than in prior art systems where many separate units were used.

Figure 4A:
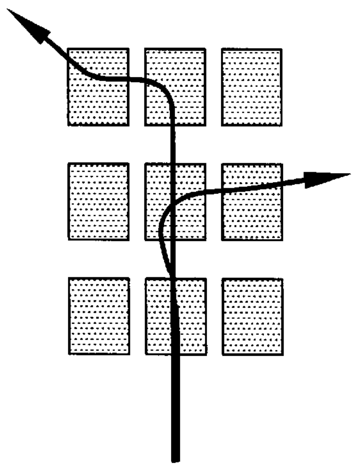
FIGS. 4A–4C are plan views of possible configurations of the magnet pole faces and their beam paths in embodiments of the present invention that have single rows of magnets or several rows of magnets.
Figure 4B:
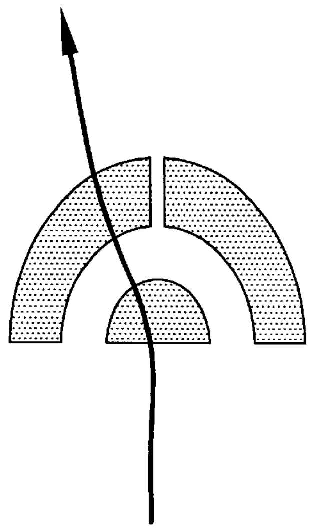
Figure 4C:
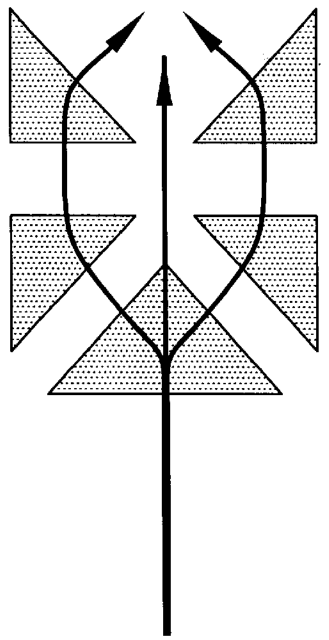

The configuration of the magnet pole faces in FIG.3, is of course not the only possible configuration that can be used. It is instead possible to use any geometrical configuration of magnet pole faces on a common yoke, the particular configuration to use being dependent on what beam paths one like to obtain. In FIGS. 4A to 4C, there are shown some exemplary geometrical configurations and their beam paths, with one row of magnets or several rows of magnets. A person skilled in the art should recognize other configurations and their beam paths. It is also possible, as is clear from FIGS. 4A to 4C, to have a stack (of rows) of magnets with a common yoke. All these different configurations could be used to deliver beams from different directions onto the products, e.g. double sided irradiation.

The embodiments and the design example given above are merely illustrations. There are other embodiments that will readily occur to one skilled in the art that are within the scope and spirit of the invention. The invention should therefore be defined as in the appended claims.

We claim:

1. An electron beam delivery system for directing beam pulses to desired positions on a product that is following a path close to said system, comprising:

accelerator means for delivering a pulsed beam of charged particles; and a directing system for controlling the beam, said directing system comprising:

power supply means for feeding coils of oppositely situated magnetic cores that define magnets to thereby generate respective magnetic fields in the gap between pairs of oppositely situated core legs, each of said coils being wound around a respective one of said core legs, and each of said core legs including a magnetic pole face, wherein all of said magnets are fixed to a common return yoke such that, upon entrance of said beam pulses into said gap, magnetic fields of consecutive magnets are selectively turned on to bend consecutive pulses of charged particles onto desired positions on the product.

2. A beam delivery system as in claim 1, wherein respective coils of each pair of said oppositely situated core legs are connected in series, and wherein each of said pairs is connected to its own power supply.

3. A beam delivery system as in claim 1, wherein at least one of said pairs of oppositely situated core legs is connected in series, and further connected to a power supply that is shared with at least one other pair of oppositely situated core legs.

4. A beam delivery system as in claim 1, wherein said power supply means includes a set of computer controlled power supplies synchronized with the pulses delivered by the accelerator means to give a desired irradiation strength.

5. A beam delivery system as in claim 4, wherein said power supplies are controlled digitally.

6. A beam delivery system as in claim 1, wherein switching of currents and amplitudes in different ones of said magnets is controlled by clock pulses from the accelerator means to thereby synchronise the beam path selection with the accelerator means.

7. A beam delivery system as in claim 1, wherein said accelerator means is an accelerator of charged particles.

8. A beam delivery system as in claim 1, wherein said beam delivery system is arranged to direct beams onto a product in at least two directions.

9. A beam delivery system as in claim 8, wherein said beam delivery system is arranged to direct beams in directions above and below the beam direction.

10. A beam delivery system as in claim 1, wherein a beam delivered from said accelerator means enters said directing system via a vacuum filled device.

11. A beam delivery system as in claim 10, where said vacuum filled device, is a vacuum tube.

12. A beam delivery system as in claim 1, wherein said pole legs and pole faces are aligned and arranged in two parallel rows.

* * * * *